United States Patent
Liou et al.

(10) Patent No.: US 9,525,041 B2
(45) Date of Patent: Dec. 20, 2016

(54) SEMICONDUCTOR PROCESS FOR FORMING GATES WITH DIFFERENT PITCHES AND DIFFERENT DIMENSIONS

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 93 days.

(21) Appl. No.: 14/621,358

(22) Filed: Feb. 12, 2015

(65) Prior Publication Data

US 2016/0240629 A1   Aug. 18, 2016

(51) Int. Cl.
| | |
|---|---|
| *H01L 21/311* | (2006.01) |
| *H01L 29/66* | (2006.01) |
| *H01L 21/033* | (2006.01) |
| *H01L 21/3213* | (2006.01) |

(52) U.S. Cl.
CPC ..... *H01L 29/66545* (2013.01); *H01L 21/0337* (2013.01); *H01L 21/32139* (2013.01); *H01L 29/6653* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 5,795,830 A | 8/1998 | Cronin | |
| 7,115,525 B2 | 10/2006 | Abatchev | |
| 7,763,531 B2 | 7/2010 | Abadeer | |
| 7,803,709 B2 | 9/2010 | Yune | |
| 8,324,036 B2 | 12/2012 | Cheng | |
| 8,735,296 B2 | 5/2014 | Jung | |
| 8,906,757 B2 | 12/2014 | Kim | |
| 2003/0015494 A1 | 1/2003 | Jayashankar | |
| 2005/0153562 A1 | 7/2005 | Furukawa | |
| 2008/0124931 A1* | 5/2008 | Lee | H01L 21/0332 438/692 |
| 2009/0004867 A1 | 1/2009 | Yune | |

(Continued)

OTHER PUBLICATIONS

Liang, Title of Invention: Fin-Shaped Structure Forming Process, U.S. Appl. No. 13/934,236, filed Jul. 3, 2013.

*Primary Examiner* — Calvin Choi
(74) *Attorney, Agent, or Firm* — Winston Hsu; Scott Margo

(57) ABSTRACT

A semiconductor process for forming gates with different pitches includes the following steps. A gate layer is formed on a substrate. A first mandrel and a second mandrel are respectively formed on the gate layer. A first spacer material is formed to conformally cover the first mandrel but exposing the second mandrel. A second spacer material is formed to conformally cover the first spacer material and the second mandrel. The first spacer material and the second spacer material are etched to form a first spacer beside the first mandrel and a second spacer beside the second mandrel simultaneously. The first mandrel and the second mandrel are removed. Layouts of the first spacer and the second spacer are transferred to the gate layer, thereby a first gate and a second gate being formed. Moreover, a semiconductor process, which forms the first spacer and the second spacer separately, is also provided.

18 Claims, 6 Drawing Sheets

(56) References Cited

U.S. PATENT DOCUMENTS

2009/0298274 A1* 12/2009 Kajiwara ........ H01L 21/823456
                                                            438/591
2013/0234301 A1    9/2013 Wang
2014/0256094 A1*   9/2014 Lin .................. H01L 29/66545
                                                            438/158

* cited by examiner

SEMICONDUCTOR PROCESS FOR FORMING GATES WITH DIFFERENT PITCHES AND DIFFERENT DIMENSIONS

BACKGROUND OF THE INVENTION

1. Field of the Invention

The present invention relates generally to a semiconductor process for forming gates with different pitches and different dimensions, and more specifically to a semiconductor process applying sidewall image transfer (SIT) techniques for forming gates with different pitches and different dimensions.

2. Description of the Prior Art

Field effect transistors are important electronic devices in the fabrication of integrated circuits, and as the size of the semiconductor devices becomes smaller and smaller, the fabrication of the transistors also has to improve and is constantly enhanced to fabricate transistors with smaller sizes and higher quality.

With the increasing miniaturization of the semiconductor devices, various multi-gate MOSFET devices have been developed. The multi-gate MOSFET is advantageous for the following reasons. First, the manufacturing processes of the multi-gate MOSFET devices can be integrated into the traditional logic device processes, and thus are more compatible. In addition, since the three-dimensional structure of the multi-gate MOSFET increases the overlapping area between the gate and the substrate, the channel region is controlled more effectively. This therefore reduces the drain-induced barrier lowering (DIBL) effect and the short channel effect. Moreover, the channel region is longer for the same gate length. Therefore, the current between the source and the drain is increased.

In another aspect, poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate, which serves as a dummy gate first, to be the control electrode.

Accordingly, the multi-gate MOSFET devices advanced by integrating with work function metal gates have been attempted in modern industry.

SUMMARY OF THE INVENTION

The present invention provides a semiconductor process for forming gates with different pitches and different dimensions, which forms dummy gates by transferring layouts of spacers.

The present invention provides a semiconductor process for forming gates with different pitches and different dimensions including the following steps. A gate layer is formed on a substrate having a first area and a second area. A first mandrel is formed on the gate layer of the first area and a second mandrel is formed on the gate layer of the second area. A first spacer material is formed in the first area to conformally cover the first mandrel but exposing the second area. A second spacer material is formed in the first area and the second area to conformally cover the first spacer material and the second mandrel. The first spacer material and the second spacer material are etched to form a first spacer beside the first mandrel and a second spacer beside the second mandrel simultaneously. The first mandrel and the second mandrel are removed. Layouts of the first spacer and the second spacer are transferred to the gate layer, thereby a first gate and a second gate being formed.

The present invention provides a semiconductor process for forming gates with different pitches and different dimensions including the following steps. A gate layer is formed on a substrate having a first area and a second area. A first mandrel is formed on the gate layer of the first area and a second mandrel is formed on the gate layer of the second area. A first spacer is formed on the substrate beside the first mandrel. A second spacer is formed on the substrate beside the second mandrel after the first spacer is formed, wherein the second spacer and the first spacer have different thicknesses. The first mandrel and the second mandrel are removed. Layouts of the first spacer and the second spacer are transferred to the gate layer, thereby a first gate and a second gate being formed.

According to the above, the present invention provides a semiconductor process for forming gates with different pitches and different dimensions, which forms a first mandrel on a gate layer of a first area and a second mandrel on the gate layer of a second area; forms a first spacer material only in the first area to conformally cover the first mandrel and forms a second spacer material in the first area and the second area to conformally cover the first spacer material and the second mandrel; etches the first spacer material and the second spacer material to form a first spacer beside the first mandrel and a second spacer beside the second mandrel simultaneously; removes the first mandrel and the second mandrel; and transfers layouts of the first spacer and the second spacer to the gate layer. Or, forms a first spacer beside the first mandrel and a second spacer beside the second mandrel sequentially after the first mandrel and the second mandrel are formed, wherein the second spacer and the first spacer must have different thicknesses; removes the first mandrel and the second mandrel; and transfers layouts of the first spacer and the second spacer to the gate layer. In these ways, a first gate and a second gate having different pitches and different critical dimensions can be formed because of the first spacer and the second spacer having different pitches and thicknesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
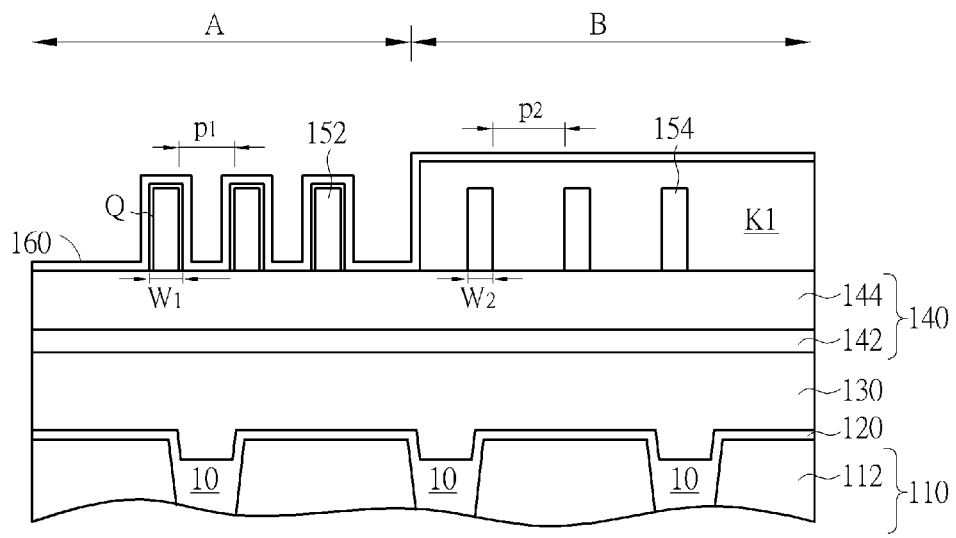
FIGS. 1-6 schematically depict cross-sectional views of a semiconductor process for forming gates with different pitches and different dimensions according to a first embodiment of the present invention.

FIGS. 1-6 schematically depict cross-sectional views of a semiconductor process for forming gates with different pitches and different dimensions according to a first embodiment of the present invention. As shown in FIG. 1, a substrate 110 is provided. The substrate 110 has a first area A and a second area B. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the substrate 110 includes fin structures 112, and the present invention is applied in a multi-gate MOSFET, but the present invention can also be applied in different semiconductor components such as a planar MOSFET, depending upon practical requirements.

Isolation structures 10 may be disposed between these fin structures 112. The isolation structures 10 may be shallow trench isolation (STI) structures, which may be formed be a shallow trench isolation (STI) process, but it is not limited thereto.

A dielectric layer 120 may be formed to conformally cover the fin structures 112 and the isolation structures 10. The dielectric layer 120 may be an oxide layer, which may be removed in a replacement metal gate (RMG) processes as a gate last for high-k last process is applied. In addition, the present invention may be applied in a gate last for high-k first process, a gate first process, a polysilicon gate process or others.

A gate layer 130 is formed to conformally cover the fin structures 112 and the isolation structures 10. In this embodiment, the gate layer 130 is a dummy gate layer, which is made of polysilicon, but it is not limited thereto. Furthermore, a hard mask layer 140 may be formed on the gate layer 130. In this embodiment, the hard mask layer 140 is a dual layer including a nitride layer 142 and an oxide layer 144 from bottom to top, but it is not limited thereto. In another embodiment, the hard mask layer 140 may be a single layer or a multilayer composed of oxide, nitride, oxynitride or others.

First mandrels 152 are formed on the gate layer 130 of the first area A while second mandrels 154 are formed on the gate layer 130 of the second area B. In this embodiment, the first mandrels 152 and the second mandrels 154 are amorphous silicon mandrels, but it is not limited thereto. It is noted that the first mandrels 152 and the second mandrels 154 may have different pitches P1/P2 to form dummy gates with different pitches P1/P2. In this case, the first mandrels 152 have the pitch P1 smaller than the pitch P2 of the second mandrels 154, but it is not limited thereto. The number of the first mandrels 152 and the second mandrels 154 depicted in the figures are respectively three, but the number of the first mandrels 152 and the second mandrels 154 is not restricted thereto. Furthermore, the first mandrels 152 and the second mandrels 154 are disposed on different fin structures 112 in this case for forming dummy gates with different pitches on different fin structures 112. However, the first mandrels 152 and the second mandrels 154 may be disposed in a same fin structure instead. In one case, the first mandrels 152 and the second mandrels 154 have common widths w1/w2; however, the first mandrels 152 and the second mandrels 154 may have different widths w1/w2, depending upon practical requirements.

Figure 2:
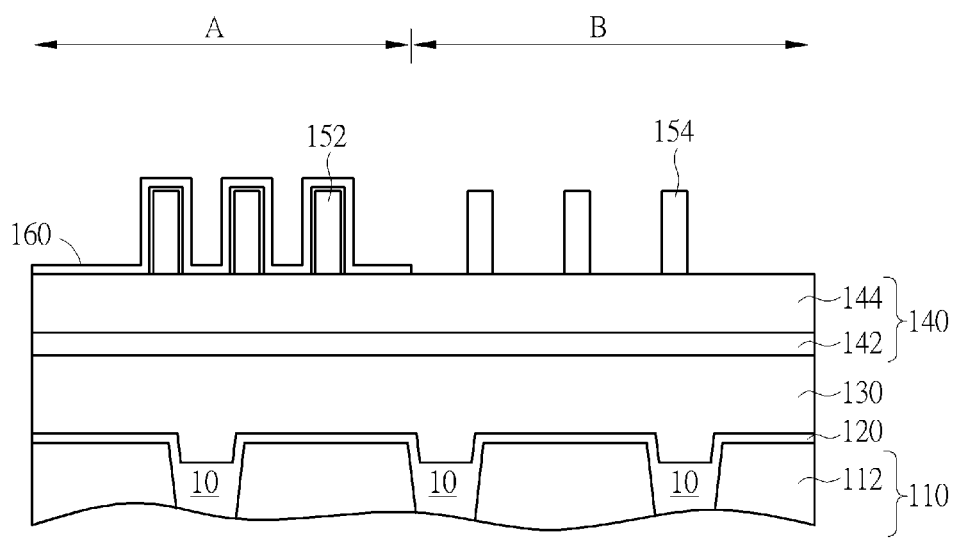

Please refer to FIGS. 1-2, an oxidation process (not shown) may be optionally performed to form oxide layers Q at surfaces of the first mandrels 152. The oxide layers Q may be formed only at the surfaces of the first mandrels 152 without forming at surfaces of the second mandrels 154. In addition, the oxide layers Q may be formed at the surfaces of the first mandrels 152 and the second mandrels 154, but the thicknesses of the oxide layers Q at the surfaces of the first mandrels 152 and at the surfaces of the second mandrels 154 must be different for forming dummy gates having different pitches later.

Then, a first spacer material 160 is formed in the first area A to conformally cover the first mandrels 152 but exposing the second area B. The first spacer material 160 may be composed of nitride, oxide, oxynitride or others. More precisely, as shown in FIG. 1, a patterned hard mask K1 may cover the second area B but exposing the first area A. Then, the first spacer material 160 may cover the first area A and the second area B. Thereafter, the first spacer material 160 in the second area B and the patterned hard mask K1 are removed, so that the first spacer material 160 can be formed in the first area A only to conformally cover the first mandrels 152 but exposing the second area B.

Accordingly, the patterned hard mask K1 may be formed and then the first spacer material 160 is formed. However, the first spacer material 160 may be formed in many other ways. Such that, a first spacer material (not shown) may blanketly cover the first area A and the second area B; a patterned hard mask (not shown) may cover the first area A while exposing the second area B; the exposed first spacer material in the second area B is removed, thereby a first spacer material only in the first area A can be formed; and then, the patterned hard mask is removed.

Figure 3:
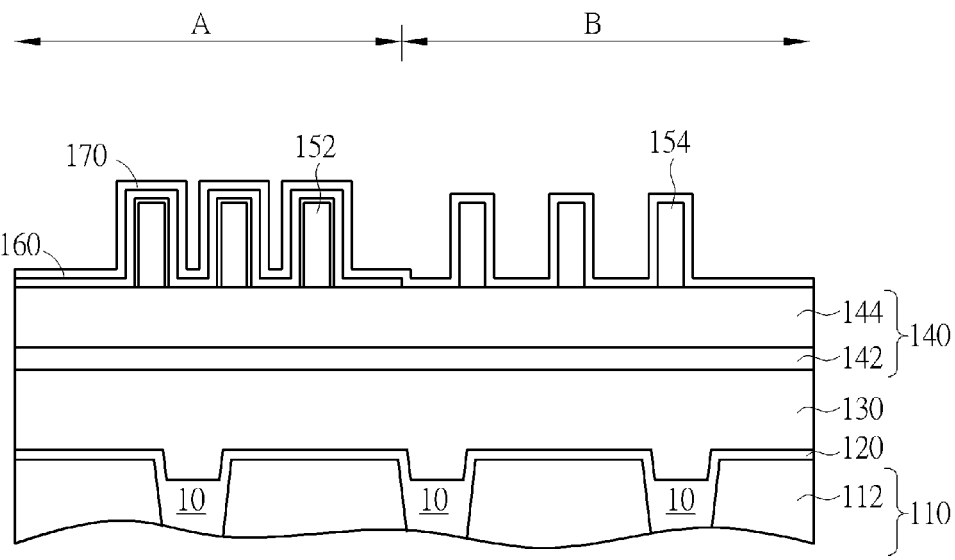

As shown in FIG. 3, a second spacer material 170 is formed in the first area A and the second area B to conformally cover the first spacer material 160 in the first area A and the second mandrels 154 in the second area B. The second spacer material 170 may be composed of nitride, oxide, oxynitride or others. The materials of the first spacer material 160 may be common to the materials of the second spacer material 170 for later spacers etching uniformity, but it is not limited thereto. The thicknesses of the first spacer material 160 and the second spacer material 170 may be different or the same. The materials of the first spacer material 160 and the second spacer material 170 must have different etching rates from the oxide layer 144 for serving the oxide layer 144 as an etch stop layer.

Figure 4:
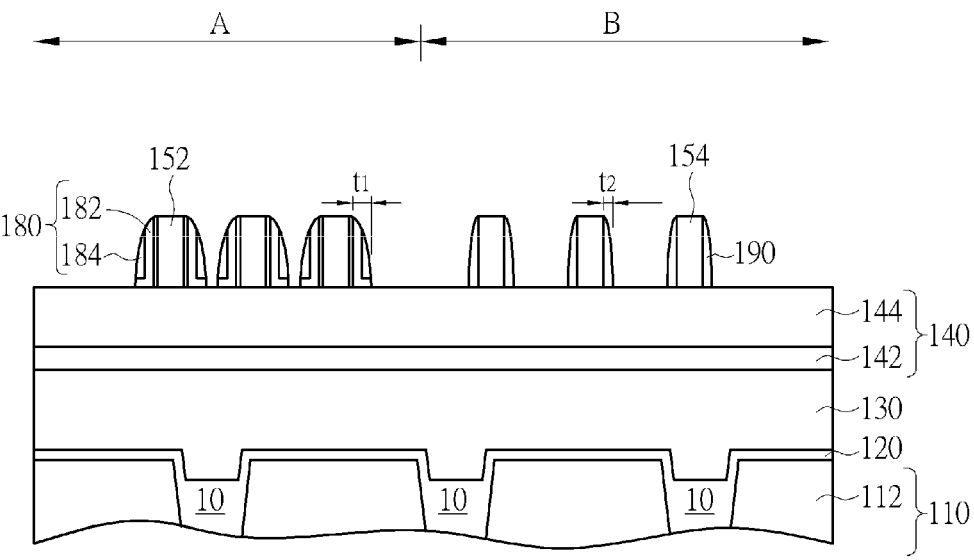

Thereafter, the first spacer material 160 and the second spacer material 170 are etched simultaneously, and thus a first spacer 180 beside each of the first mandrels 152 is formed while a second spacer 190 beside each of the second mandrels 154 is formed, as shown in FIG. 4. That is, the first spacer 180 is formed by etching the first spacer material 160 and the second spacer material 170 in the first area A, so that the first spacer 180 is a dual spacer including an inner spacer 182 having an L-shaped cross-sectional profile and an outer spacer 184 having a boat-shaped cross-sectional profile; the second spacer 190 is formed by etching the second spacer material 170 only, so that the second spacer 190 is just a single spacer having a boat-shaped cross-sectional profile. Therefore, a thickness t1 of the first spacer 180 is larger than a thickness t2 of the second spacer 190. The thickness t1 and the thickness t2 can be controlled by adjusting the thicknesses of the first spacer material 160 and the second spacer material 170. In this embodiment, two spacer materials such that the first spacer material 160 and the second spacer material 170 are formed, but there may be multi spacer materials such as three or more than three being formed.

Figure 5:
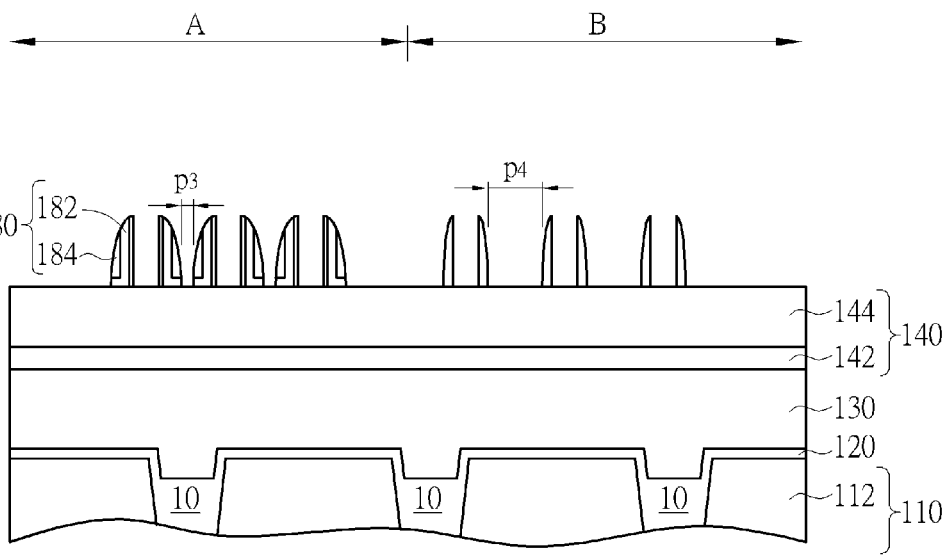

The first mandrels 152 and the second mandrels 154 are removed, as shown in FIG. 5. Since the first mandrels 152 and the second mandrels 154 have different pitches p1/p2 (as shown in FIG. 1) and the first spacers 180 and the second spacers 190 have different thicknesses t1/t2, the first spacers 180 and the second spacers 190 inherently have different pitches p3/p4.

Figure 6:
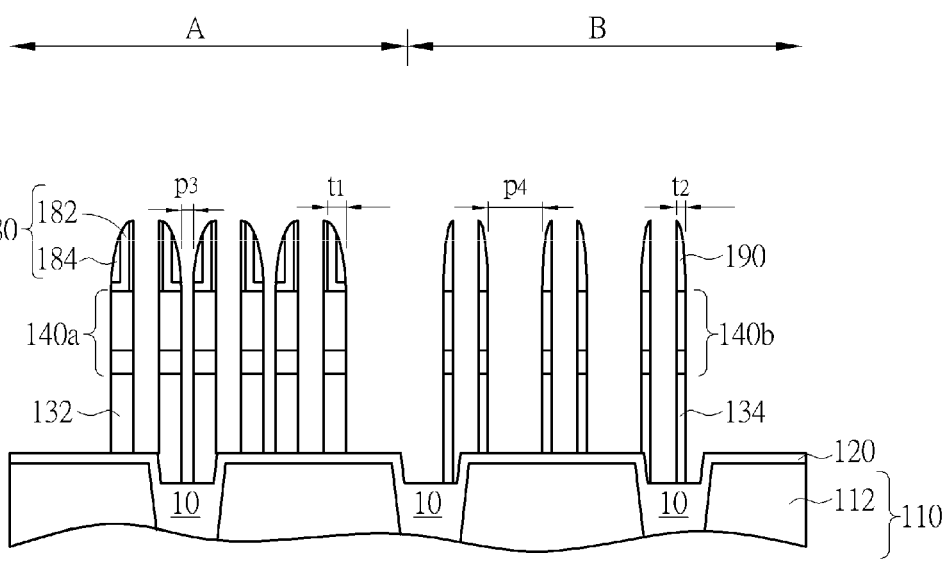

Layouts of the first spacers 180 and the second spacers 190 are transferred to the gate layer 130, thereby first gates 132 and second gates 134 being formed, as shown in FIG. 6. More precisely, the layouts of the first spacers 180 and the second spacers 190 are transferred to the hard mask layer 140 to form first hard masks 140a and second hard masks 140b, and then layouts of the first hard masks 140a and the second hard masks 140b are transferred to form the first gates 132 and the second gates 134. Thereafter, the first spacers 180, the second spacers 190, the first hard masks 140a and the second hard masks 140b are removed.

In addition, the layouts of the first spacers 180 and the second spacers 190 are transferred to the hard mask layer 140 to form first hard masks 140a and second hard masks 140b, and then the first spacers 180 and the second spacers 190 are removed. Thereafter, the layouts of the first hard masks 140a and the second hard masks 140b are transferred to form the first gates 132 and the second gates 134, and then the first hard masks 140a and the second hard masks 140b are removed.

A cutting process (not shown) for cutting the first spacers 180, the second spacers 190, the first hard masks 140a and the second hard masks 140b may be performed before/after the first mandrels 152 and the second mandrels 154 are removed, and then the first gates 132 and the second gates 134 are formed.

In this embodiment, the first gates 132 and the second gates 134 are dummy gates, which may be replaced by metal gates through a replacement metal gate (RMG) process or may be removed in later processes, but it is not limited thereto. Since the first spacers 180 and the second spacers 190 have different pitches p3/p4 and different thicknesses t1/t2, the first gates 132 and the second gates 134 inherently have different pitches p3/p4 and different critical dimensions (CD).

Above all, the first spacers 180 and the second spacers 190 of this embodiment are formed simultaneously by etching the first spacer material 160 and the second spacer material 170 at the same time, thereby each of the first spacers 180 is a dual spacer including an inner spacer 182 having an L-shaped cross-sectional profile and an outer spacer 184 having a boat-shaped cross-sectional profile while each of the second spacers 190 is just a single spacer having a boat-shaped cross-sectional profile. In addition, first spacers and second spacers of the present invention can also be formed separately.

FIGS. 7-11 schematically depict cross-sectional views of a semiconductor process for forming gates with different pitches and different dimensions according to a second embodiment of the present invention, which forms first spacers and then forms second spacers.

The previous processing step of this embodiment is the same as the previous processing step of FIG. 1 of the first embodiment. This means: the gate layer 130 is formed to conformally cover the fin structures 112 and the isolation structures 10; the first mandrels 152 are formed on the gate layer 130 of the first area A while the second mandrels 154 are formed on the gate layer 130 of the second area B.

In this embodiment, the gate layer 130 is a dummy gate layer, which is made of polysilicon, but it is not limited thereto. Furthermore, a hard mask layer 140 may be formed on the gate layer 130. In this embodiment, the hard mask layer 140 is a dual layer including a nitride layer 142 and an oxide layer 144 from bottom to top, but it is not limited thereto. In another embodiment, the hard mask layer 140 may be a single layer or a multilayer composed of oxide, nitride oxynitride or others.

In this embodiment, the first mandrels 152 and the second mandrels 154 are amorphous silicon mandrels, but it is not limited thereto. It is noted that, the first mandrels 152 and the second mandrels 154 may have different pitches P1/P2 to form dummy gates with different pitches. In this case, the first mandrels 152 have the pitch P1 smaller than the pitch P2 of the second mandrels 154, but it is not limited thereto. The number of the first mandrels 152 and the second mandrels 154 depicted on the figures are respectively three, but the number of the first mandrels 152 and the second mandrels 154 is not restricted thereto. Furthermore, the first mandrels 152 and the second mandrels 154 are disposed in different fin structures 112 in this case for forming dummy gates with different pitches on different fin structures 112. However, the first mandrels 152 and the second mandrels 154 may be disposed in a same fin structure instead. In one case, the first mandrels 152 and the second mandrels 154 have common widths w1/w2; however, the first mandrels 152 and the second mandrels 154 may have different widths w1/w2, depending upon practical requirements.

A first spacer material 160 is formed in the first area A to conformally cover the first mandrels 152 but exposing the second area B. The first spacer material 160 may be composed of nitride, oxide, oxynitride or others. More precisely, as shown in FIG. 1, a patterned hard mask K1 may cover the second area B but exposing the first area A. Then, the first spacer material 160 may cover the first area A and the second area B.

Figure 7:
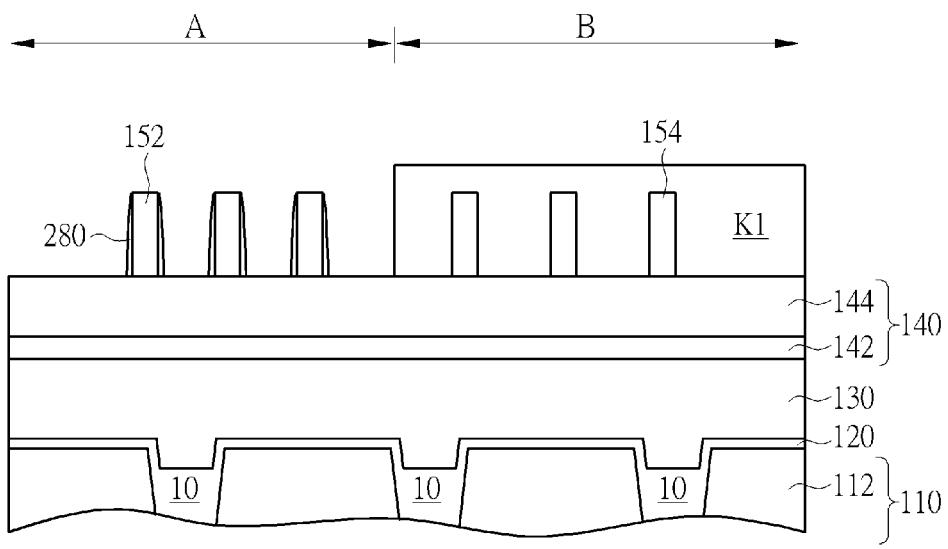
FIGS. 7-11 schematically depict cross-sectional views of a semiconductor process for forming gates with different pitches and different dimensions according to a second embodiment of the present invention.

Then, the first spacer material 160 is etched to form first spacers 280, as shown in FIG. 7. Thereafter, the patterned hard mask K1 is removed, so that the first spacers 280 can be formed besides the first mandrels 152 only.

In addition, the first spacer material 160 may blanketly cover the first mandrels 152 and the second mandrels 154; a first patterned hard mask (not shown) may cover the second area B; the exposed first spacer material 160 in the first area A is etched to form the first spacers 280; and then, a second patterned hard mask (not shown) may cover the first area A to remove the first patterned hard mask and the reserved first spacer material 160 in the second area B. However, the method of sequentially forming the patterned hard mask K1 and the first spacer material 160 is better than the method of sequentially forming the first spacer material 160 and the two patterned hard masks due to simplified processing steps.

Figure 8:
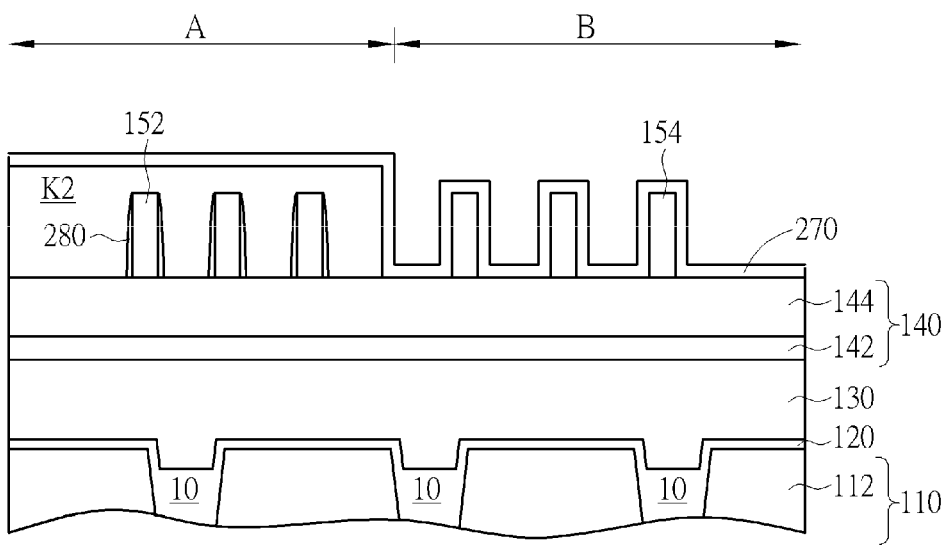

As shown in FIG. 8, a patterned hard mask K2 covers the first area A but exposing the second area B. Then, a second spacer material 270 covers the second area B to conformally cover the second mandrels 154, and the first area A. The second spacer material 270 may be composed of nitride, oxide, oxynitride or others. The materials of the first spacer material 160 may be common to the materials of the second spacer material 270 for later layout transferring uniformity, but it is not limited thereto.

Figure 9:
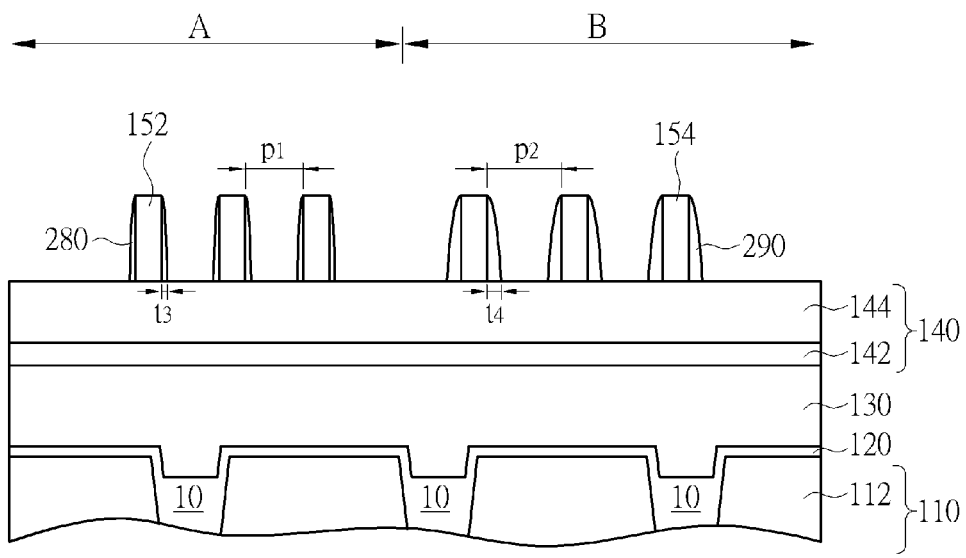

Thereafter, the second spacer material 270 is etched to form second spacers 290 beside the second mandrels 154 after the first spacers 280 are formed, as shown in FIG. 9. Then, the patterned hard mask K2 is removed immediately. It is noted that, the second spacers 290 and the first spacers 280 must have different thicknesses t3/t4 for transferring layouts of the second spacers 290 and the first spacers 280 to the gate layer 130 to form gates having different pitches. The second spacers 290 and the first spacers 280 both are single layers having boat-shaped cross-sectional profiles. The thickness t3 and the thickness t4 can be controlled by adjusting the thicknesses of the first spacer material 160 and the second spacer material 270. In this embodiment, the first spacer material 160 and the second spacer material 270 are single layers, but there may be multi-layers.

Figure 10:
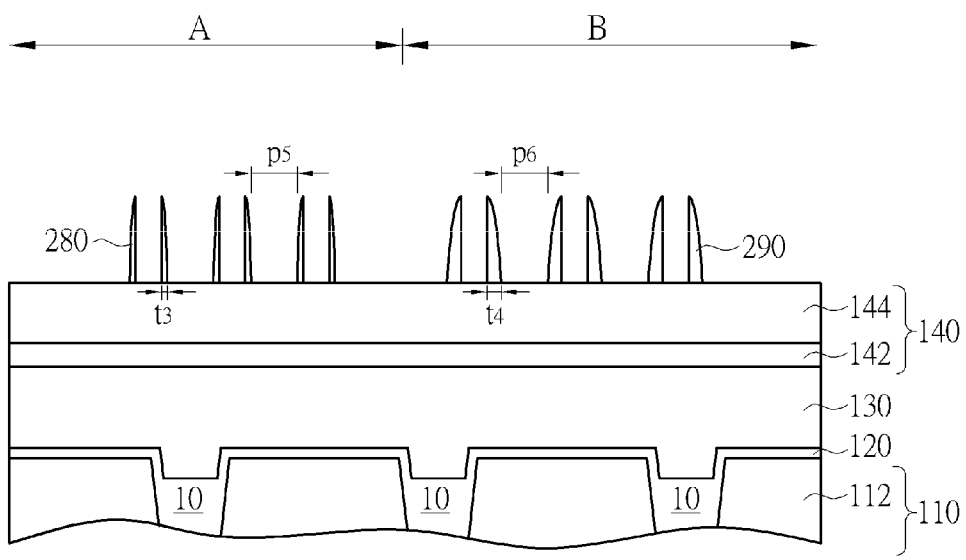

Then, the first mandrels 152 and the second mandrels 154 are removed, as shown in FIG. 10. Since the first mandrels 152 and the second mandrels 154 have different pitches p1/p2 (as shown in FIG. 1) and the first spacers 280 and the second spacers 290 have different thicknesses t3/t4, the first spacers 280 and the second spacers 290 inherently have different pitches p5/p6. The first spacers 280 and the second spacers 290 must have different etching rates from that of the oxide layer 144 for serving the oxide layer 144 as an etch stop layer.

Figure 11:
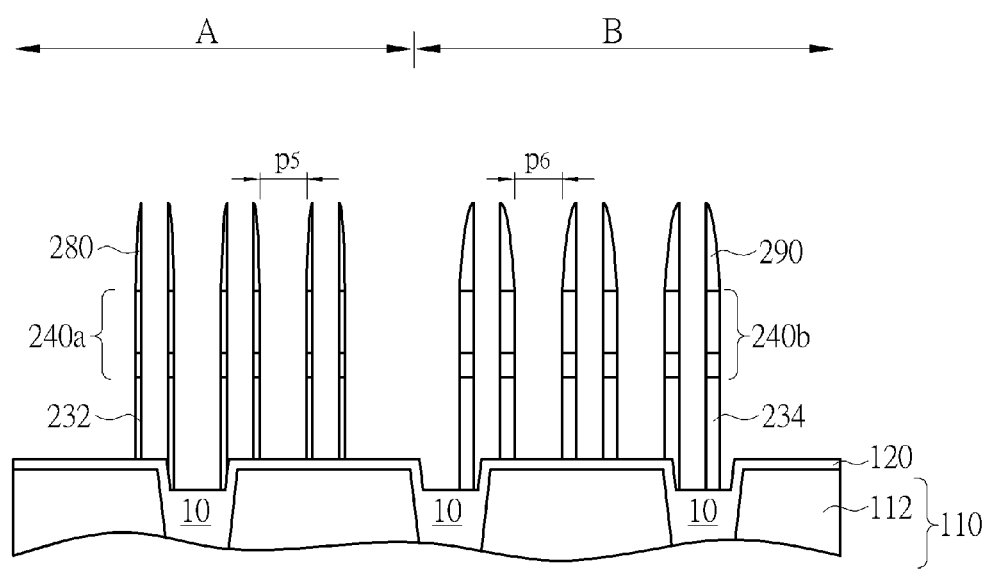

Layouts of the first spacers 280 and the second spacers 290 are transferred to the gate layer 130, thereby first gates 232 and second gates 234 being formed, as shown in FIG. 11. More precisely, the layouts of the first spacers 280 and the second spacers 290 are transferred to the hard mask layer 140 to form first hard masks 240a and second hard masks 240b, and then layouts of the first hard masks 240a and the second hard masks 240b are transferred to form the first gates 232 and the second gates 234. Thereafter, the first spacers 280, the second spacers 290, the first hard masks 240a and the second hard masks 240b are removed.

In addition, the layouts of the first spacers 280 and the second spacers 290 are transferred to the hard mask layer 140 to form the first hard masks 240a and the second hard masks 240b, and then the first spacers 280 and the second spacers 290 are removed. Thereafter, the layouts of the first hard masks 240a and the second hard masks 240b are transferred to form the first gates 232 and the second gates 234, and then the first hard masks 240a and the second hard masks 240b are removed.

A cutting process (not shown) for cutting the first spacers 280, the second spacers 290, the first hard masks 240a and the second hard masks 240b may be performed before/after the first mandrels 152 and the second mandrels 154 are removed, and then the first gates 232 and the second gates 234 are formed.

In this embodiment, the first gates 232 and the second gates 234 are dummy gates, which may be replaced by metal gates through a replacement metal gate (RMG) process or may be removed in later processes, but it is not limited thereto. Since the first spacers 280 and the second spacers 290 have different pitches p5/p6 and different thicknesses t3/t4, the first gates 232 and the second gates 234 inherently have different pitches p5/p6 and different critical dimensions (CD).

Moreover, before the first spacers 280 and the second spacers 290 are formed, an oxidation process (not shown) may be optionally performed to form oxide layers (not shown) at surfaces of the first mandrels 152 and the second mandrels 154 respectively. In one case, the oxide layers are formed both at the surfaces of the first mandrels 152 and the second mandrels 154, wherein the oxide layers at the surfaces of the first mandrels 152 and the second mandrels 154 must have different thicknesses to change pitches p5/p6 and critical dimensions of the first gates 232 and second gates 234. In another case, the oxide layer may be formed at the surfaces of the first mandrels 152 only without being formed at the surfaces of the second mandrels 154.

To summarize, the present invention provides a semiconductor process, which forms a first mandrel on a gate layer of a first area and a second mandrel on the gate layer of a second area, wherein the first mandrel and the second mandrel preferably have different pitches; forms a first spacer material in the first area to conformally cover the first mandrel but exposing the second area; forms a second spacer material in the first area and the second area to conformally cover the first spacer material and the second mandrel; etches the first spacer material and the second spacer material to form a first spacer beside the first mandrel and a second spacer beside the second mandrel simultaneously, thereby only the first spacer including an inner spacer having an L-shaped cross-sectional profile, and the pitch and the thickness of the first spacer is inherently different from the pitch and the thickness of the second spacer; removes the first mandrel and the second mandrel; and transfers layouts of the first spacer and the second spacer to the gate layer. Since the first spacer and the second spacer have different pitches and thicknesses, a first gate and a second gate having different pitches and different critical dimensions can be formed.

Moreover, the present invention also provides a semiconductor process, which forms a first mandrel on a gate layer of a first area and a second mandrel on the gate layer of a second area, wherein the first mandrel and the second mandrel preferably have different pitches; forms a first spacer beside the first mandrel; forms a second spacer beside the second mandrel after the first spacer is formed, wherein the second spacer and the first spacer must have different thicknesses; removes the first mandrel and the second mandrel; and transfers layouts of the first spacer and the second spacer to the gate layer. By doing this, since the first spacer and the second spacer have different thicknesses, a first gate and a second gate having different pitches and different critical dimensions can be formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process for forming gates with different pitches and different dimensions, comprising:
   forming a gate layer on a substrate having a first area and a second area;
   forming a first mandrel on the gate layer of the first area and a second mandrel on the gate layer of the second area;
   forming a first spacer material in the first area to conformally cover the first mandrel but exposing the second area, wherein the step of forming the first spacer material in the first area to conformally cover the first mandrel but exposing the second area comprises: covering a patterned hard mask in the second area while exposing the first area; and covering the first spacer material in the first area;
   forming a second spacer material in the first area and the second area to conformally cover the first spacer material and the second mandrel;
   etching the first spacer material and the second spacer material to form a first spacer beside the first mandrel and a second spacer beside the second mandrel simultaneously;
   removing the first mandrel and the second mandrel; and
   transferring layouts of the first spacer and the second spacer to the gate layer, thereby a first gate and a second gate being formed.

2. The semiconductor process according to claim 1, wherein the substrate has fin structures, and the first mandrel and the second mandrel are on the different fin structures.

3. The semiconductor process according to claim 1, wherein the first spacer comprises an inner spacer having an L-shaped cross-sectional profile.

4. The semiconductor process according to claim 1, wherein the gate layer comprises a polysilicon layer, and the first mandrel and the second mandrel comprise amorphous silicon mandrels.

5. The semiconductor process according to claim 1, further comprising:
forming a hard mask layer sandwiched by the gate layer, and the first mandrel and the second mandrel.

6. The semiconductor process according to claim 5, wherein the step of transferring layouts of the first spacer and the second spacer to the gate layer comprises transferring layouts of the first spacer and the second spacer to the hard mask layer to form a first hard mask and a second hard mask, and then transferring layouts of the first hard mask and the second hard mask to form the first gate and the second gate.

7. The semiconductor process according to claim 1, wherein the first gate and the second gate comprise dummy gates.

8. The semiconductor process according to claim 1, wherein the first gate and the second gate have different pitches and different critical dimensions (CD).

9. The semiconductor process according to claim 1, further comprising:
performing an oxidation process to form an oxide layer at surfaces of the first mandrel before the first spacer material is formed.

10. A semiconductor process for forming gates with different pitches and different dimensions, comprising:
forming a gate layer on a substrate having a first area and a second area;
forming a first mandrel on the gate layer of the first area and a second mandrel on the gate layer of the second area;
forming a first spacer on the substrate beside the first mandrel, wherein the step of forming the first spacer on the substrate beside the first mandrel comprise: covering a patterned hard mask in the second area while exposing the first area; forming a first spacer material in the first area to conformally cover the first mandrel; etching the first spacer material to form the first spacer on the substrate beside the first mandrel; and removing the patterned hard mask;
forming a second spacer on the substrate beside the second mandrel after the first spacer is formed, wherein the second spacer and the first spacer have different thicknesses;
removing the first mandrel and the second mandrel; and
transferring layouts of the first spacer and the second spacer to the gate layer, thereby a first gate and a second gate being formed.

11. The semiconductor process according to claim 10, wherein the substrate has fin structures, and the first mandrel and the second mandrel are on the different fin structures.

12. The semiconductor process according to claim 10, wherein the step of forming the second spacer on the substrate beside the second mandrel comprises:
covering a patterned hard mask in the first area while exposing the second area;
forming a second spacer material in the second area to conformally cover the second mandrel;
etching the second spacer material to form the second spacer on the substrate beside the second mandrel; and
removing the patterned hard mask.

13. The semiconductor process according to claim 10, wherein the gate layer comprises a polysilicon layer, and the first mandrel and the second mandrel comprise amorphous silicon mandrels.

14. The semiconductor process according to claim 10, further comprising:
forming a hard mask layer sandwiched by the gate layer, and the first mandrel and the second mandrel.

15. The semiconductor process according to claim 14, wherein the step of transferring layouts of the first spacer and the second spacer to the gate layer comprises:
transferring layouts of the first spacer and the second spacer to the hard mask layer to form a first hard mask and a second hard mask, and then transferring layouts of the first hard mask and the second hard mask to form the first gate and the second gate.

16. The semiconductor process according to claim 10, wherein the first gate and the second gate comprise dummy gates.

17. The semiconductor process according to claim 10, wherein the first gate and the second gate have different pitches and different critical dimensions (CD).

18. The semiconductor process according to claim 10, further comprising:
performing an oxidation process to form an oxide layer at surfaces of the first mandrel before the first spacer is formed.

* * * * *